United States Patent [19]

Grodinsky et al.

[11] Patent Number: 4,594,561

[45] Date of Patent: Jun. 10, 1986

[54] AUDIO AMPLIFIER WITH RESISTIVE DAMPING FOR MINIMIZING TIME DISPLACEMENT DISTORTION

[75] Inventors: Robert M. Grodinsky, Skokie; David G. Cornwell, Chicago, both of Ill.

[73] Assignee: RG Dynamics, Inc., Skokie, Ill.

[21] Appl. No.: 665,049

[22] Filed: Oct. 26, 1984

[51] Int. Cl.[4] .............................................. H03F 1/30
[52] U.S. Cl. ...................................... 330/297; 330/149
[58] Field of Search ............... 323/233, 268, 269, 352; 330/149, 297; 363/89, 126

[56] References Cited

U.S. PATENT DOCUMENTS

| | | | |
|---|---|---|---|
| 2,766,331 | 10/1956 | Birkemeier | 179/171 |
| 3,026,378 | 4/1962 | Fine | 179/100.1 |
| 3,168,710 | 2/1965 | Schultz | 330/34 |
| 3,222,455 | 12/1965 | Golik | 179/1 |
| 3,401,272 | 9/1968 | Rosa et al. | 323/233 X |
| 3,441,868 | 4/1969 | Anderson | 330/149 |
| 3,649,927 | 3/1972 | Seidel | 330/124 |
| 3,755,754 | 8/1973 | Putz | 330/149 |
| 3,851,269 | 11/1974 | Szorc | 330/13 |
| 4,156,276 | 5/1979 | Tanabe et al. | 363/126 |
| 4,189,973 | 2/1980 | Doane | 84/1.27 |
| 4,229,618 | 10/1980 | Gamble | 179/1 F |
| 4,232,271 | 11/1980 | Dobkin et al. | 330/258 |
| 4,275,267 | 6/1981 | Kurtin | 179/1 J |
| 4,404,462 | 9/1983 | Murray | 219/497 |
| 4,445,095 | 4/1984 | Carver | 330/297 |
| 4,454,478 | 6/1984 | Yokoyama | 330/254 |

*Primary Examiner*—Eugene R. LaRoche
*Assistant Examiner*—Steven J. Mottola
*Attorney, Agent, or Firm*—Nicholas A. Camasto

[57] ABSTRACT

A high quality amplifier includes energy dissipating resistors coupled across reactive components which are subject to shock excitation by audio signals, thus giving rise to time displacement distortion. The range of resistor values is from 5K to 100K with a preferred range being from 10K to 50K ohms. The power transformer has each winding shunted by an energy dissipating resistor chosen to produce a current draw of between 1 and 5 milliamperes.

8 Claims, 5 Drawing Figures

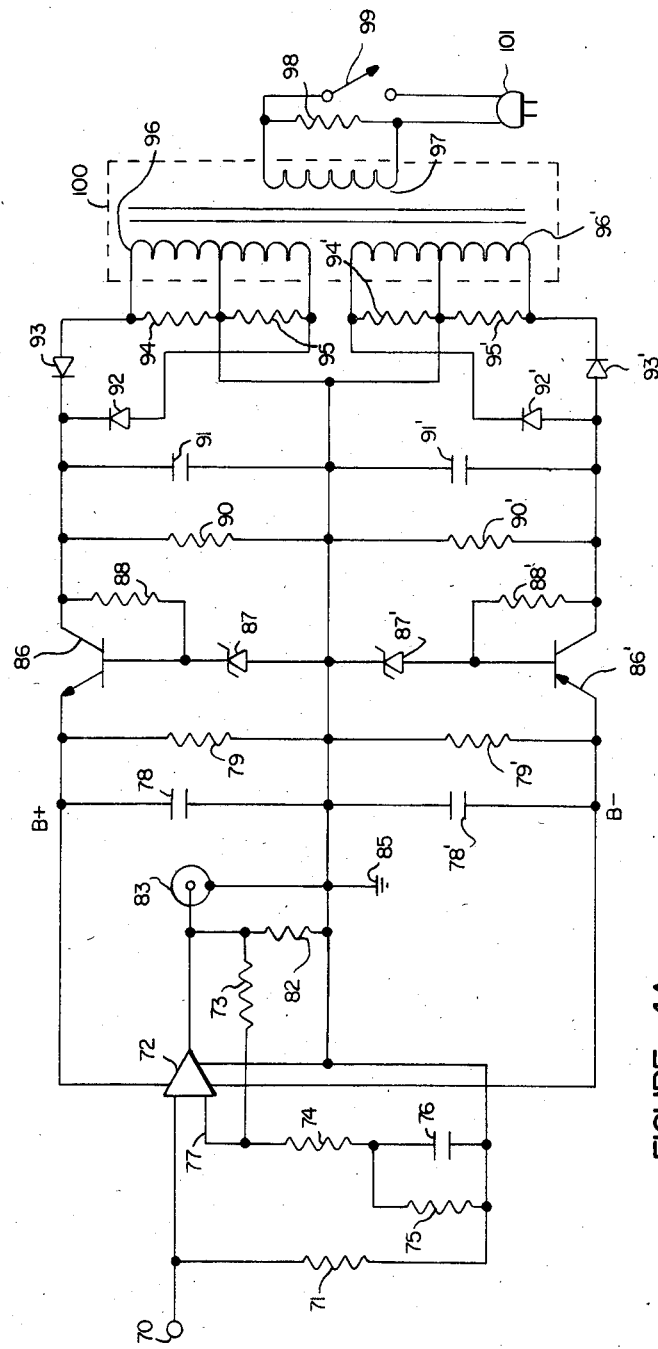
FIGURE 3
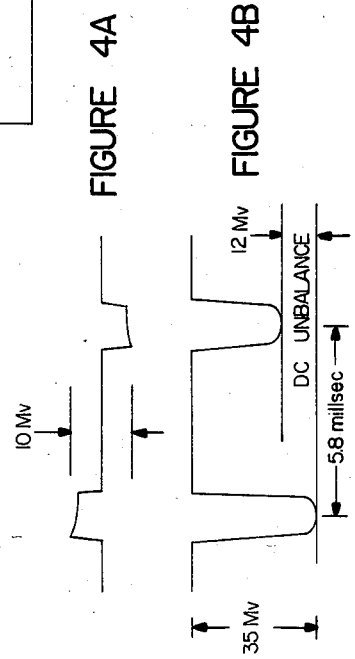
FIGURE 4A
FIGURE 4B

AUDIO AMPLIFIER WITH RESISTIVE DAMPING FOR MINIMIZING TIME DISPLACEMENT DISTORTION

CROSS REFERENCE TO RELATED PATENT APPLICATION

This application is related to Application Ser. No. 610,617, filed May 16, 1984 entitled "Ultra-High Resolution Loud Speaker System" in the names of R. Grodinsky and D. Cornwell and assigned to RG Dynamics, Inc., which application is hereby incorporated by reference.

BACKGROUND OF THE INVENTION AND PRIOR ART

This invention relates to reduction of distortion in audio systems and particularly to reduction of distortion in amplifiers from heretofore unrecognized causes.

In the co-pending application referred to above, the previously unrecognized effects of time displacement distortions on audio sound quality in speaker systems was disclosed. Such distortions are, in general, due to radio freqency (RF) energy pickup and stored energy in non-linear reactive elements, both of which contribute to increasing the so-called "noise floor" of the system. An increase in the noise floor reduces the system dynamic signal range capability such that sharp differentiations between "periods of sound" and "periods of silence" are lost. Anything that increases the system noise floor is detrimental to good quality audio reproduction. These effects may only be discernible by discriminating listeners with high quality audio equipment. Time displacement distortions in speaker systems incorporating crossover networks, for dividing the frequency spectrum among a plurality of drivers, were especially dealt with. In particular, control of the specific driver back EMF energy was accomplished with back EMF dissipating resistors.

The present invention is directed to improvements in the sound of audio amplifier circuits by reducing energy storage by shock excited reactive circuit elements. This energy is believed to modulate the various junctions of transistor amplifying devices, generally through the power supply and ground connections to the devices. The shock excitation of reactive elements such as capacitors and inductors is believed to result from the transient and unsymmetrical nature of audio signals which produce a continuum of undesirable transient signal currents. While these undesirable signals across the reactive elements may be small in magnitude, on the order of a few millivolts or less, they are not insignificant because the signal voltage required across the input terminals of transistors is in the same range. Further, the distortion effects produced are cumulative. Even though each individual distortion may be miniscule, their combined effect is quite noticeable. Circuits constructed in accordance with prior art techniques suffer in varying degrees from these distortion effects and, it is believed, that all such circuits can benefit from the application of the prinicples of the invention.

Since the nature of sound is periods of energy separated by periods of silence, the importance of accurately reproducing the distinction between these two states is immediately apparent. The distortion produced by shock excitation of capacitors and inductors in the audio signal path partially "fills in" the periods of silence and is quite noticeable in high quality audio systems. These time displacement distortions are similar to the frequency modulation distortion produced by speed variations in tape recorders and turntables. A difference is that the time displacement distortion is a function of the ability of the audio signal to shock excite the reactive circuit element and is therefore dependent upon the characteristics of the signal itself. In particular, the distortion is related to the amount of transient energy in the signal. The prior art has not recognized this form of distortion.

It has been found that time displacement distortions can be reduced significantly by providing a resistive energy-dissipating path for each reactive component. One would think that to be effective the shunt resistors would have to be low in value, particularly when used with large values of capacitance and inductance. Surprisingly however, it has been discovered that resistor values in the tens of thousands of ohms can provide the desired distortion reduction. Thus, the overall efficiency of the amplifier is not compromised. In the prior art, shunt resistors across reactive components are only found across capacitors that are capable of dangerous levels of energy storage and are designed to discharge such capacitors quickly to reduce that danger. The high value shunt resistors of the present invention are thus quite different from the shunt resistors used in the prior art. The energy dissipating resistors of the invention are also used in discharge paths for capacitors having minimal energy storage and no capability for dangerous energy levels, as well as across inductive elements, such as transformers.

OBJECTS OF THE INVENTION

A principal object of the invention is to provide an improved amplifier.

A further object of the invention is to provide audio signal translation circuits of improved resolution and dynamic range.

Another object of the invention is to reduce heretofore unrecognized time displacement distortions in audio amplifiers.

A still further object of the invention is to provide a novel feedback amplifier.

Still another object of the invention is to provide an improved transformer power supply for an audio amplifier.

SUMMARY OF THE INVENTION

In accordance with the invention, an amplifier system having a gain stage supplied with an audio signal, includes reactive signal handling and power supply components. Resistive energy-absorbing components, in the range of from 5 K to 100 K ohms, are coupled across at least some of the reactive signal handling and power supply components for reducing time displacement distortions.

BRIEF DESCRIPTION OF THE DRAWINGS

These and other objects of the invention will be apparent upon reading the following description in conjunction with the drawings in which:

FIG. 3 is a schematic diagram of a feedback amplifier constructed in accordance with the invention.

FIG. 4a and 4b are waveforms useful in explaining one aspect of the invention.

DESCRIPTION OF THE PREFERRED EMBODIMENTS

Figure 1:
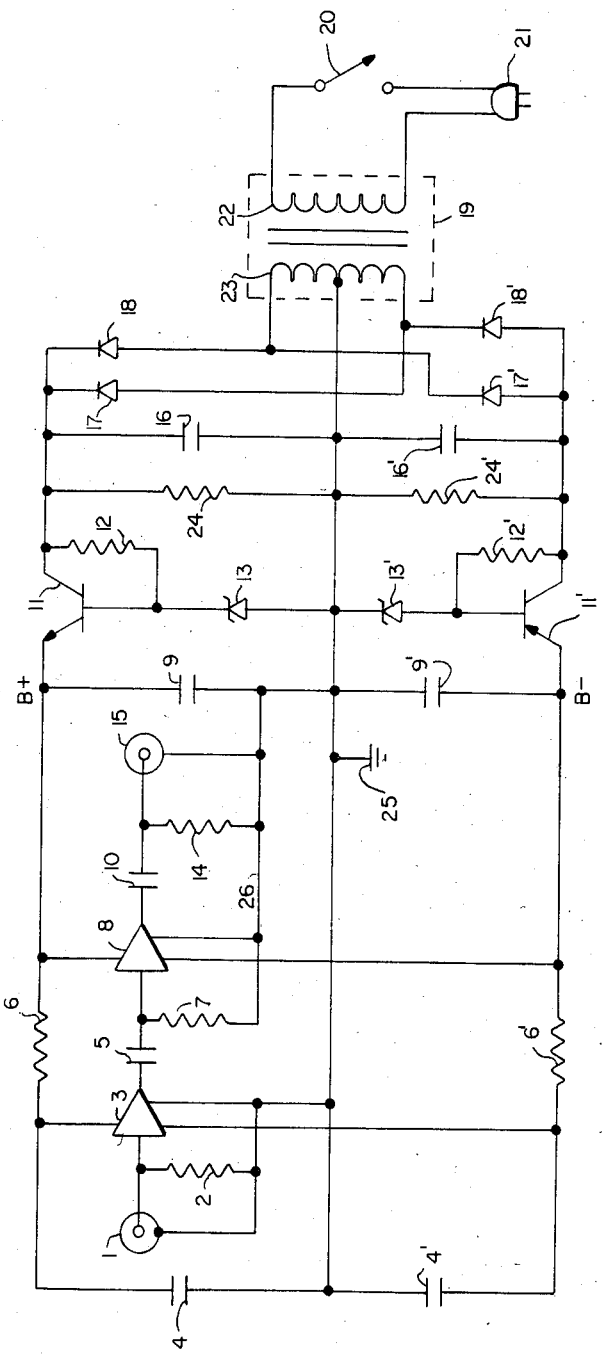
FIG. 1 is a schematic diagram of a two-stage prior art amplifier.

A typical prior art audio amplifying circuit is shown in FIG. 1. A signal input terminal 1 for coupling audio signals is provided to a first amplifier 3 and the output of amplifier 3 is coupled, through a coupling capacitor 5, to the input of a second amplifier 8. A pair of resistors 2 and 7 establish ground references to amplifers 3 and 8, respectively. The output of amplifier 8 is coupled to an output terminal 15 through another coupling capacitor 10. A resistor 14, connected between terminal 15 and ground, establishes a ground reference for the output signal. A conventional power transformer 19 has a primary winding 22 energized from a source of AC line current by means of a plug 21 and a switch 20. A center tapped secondary winding 23 is provided on transformer 19 and is coupled to a pair of power diodes 17 and 18 to provide B+ voltage and to a pair of power diodes 17' and 18' to provide B− voltage. The B+ output is filtered by a filter capacitor 16 and the B− output is filtered by a filter capacitor 16'. The B+ output is supplied to a "beta multiplier" filter consisting of a transistor 11 for further removing ripple from the DC voltage developed. A pi connected arrangement of a capacitor 9, a resistor 6 and a capacitor 4 is connected to the emitter of transistor 11 for decoupling amplifier 3 from amplifier 8. The B− output is filtered similarly by beta multiplier transistor 11', capacitor 9', resistor 6' and capacitor 4'.

Typically, the B+ and B− DC voltages range from 5 to 50 volts and capacitors 4, 4', 9, 9', 16 and 16' are of have values in the hundreds of microfarad range. Resistors 6 and 6' are generally between 100 and 1000 ohms. The two amplifiers have separate ground returns, indicated as leads 26 and 27, wired in common according to older prior art teachings. Modern prior art recognizes that common amplifier currents are to be avoided to prevent unwanted feedback between amplifiers such as amplifiers 3 and 8. Resistors 24 and 24' are provided across capacitor 16 and 16' to quickly discharge the power supply capacitors. These resistors are never used except when the energy storage of the power supply is large, usually in excess of 50 joules. Needless to say, such power supplies are extremely rare. Energy storage is calculated by the formula $J=\frac{1}{2} CV^2$ where J is equal to energy in joules, C is the capacity in farads and V is the voltage in volts. Resistors 24 and 24' are in the range of 100 to 1000 ohms and must be capable of dissipating energy equal to $E^2/R$, where E is the power supply voltage. These resistors usually have power ratings in excess of 5 watts.

As mentioned above, the problems associated with this prior art amplifying circuit arise from the transient and unsymmetrical nature of audio signals. These audio signals result in current variations in the amplifiers and DC voltage shifts in both the filter capacitors and the coupling capacitors, which fluctuations are reflected back to the power transformer. The result is that each of the reactive elements is continuously being shock excited to varying degrees by the audio signals and the resulting current and voltage fluctuations are insufficiently damped by the normal circuit loading of the amplifiers. Current variations in the power supply filter capacitors 4 and 4' are coupled into amplifier 3 by the common impedance of ground return lead 27. These current fluctuations add noise and distortion to the signal. The instantaneous AC voltages, as well as the DC voltages, at the output of amplifiers 3 and 8 are not zero because of the asymmetrical nature of the audio signals. Thus coupling capacitors 5 and 10 are not adequately damped by amplifiers 3 and 8, respectively, even when the amplifiers have a low output impedance.

The shock excited voltage variations across the capacitors, therefore, add noise and produce distortion by modulation of the amplifier input signals at the terminals to which they are connected. Further distortion occurs by modulation of the junctions of the semiconductors by variations in the power supply voltages. For example, if any of the transistor or diode junctions in amplifiers 3 or 8 are modulated by variations in the B+ or B− supply voltage, they will generate additional distortion. While it is recognized that in well-designed power supplies such variations are small, even the minute resulting distortions are readily audible in a high resolution audio system. The Zener diodes connected in the base circuits of transistors 11 and 11' help minimize such DC variations, but cannot fully eliminate them.

Figure 2:
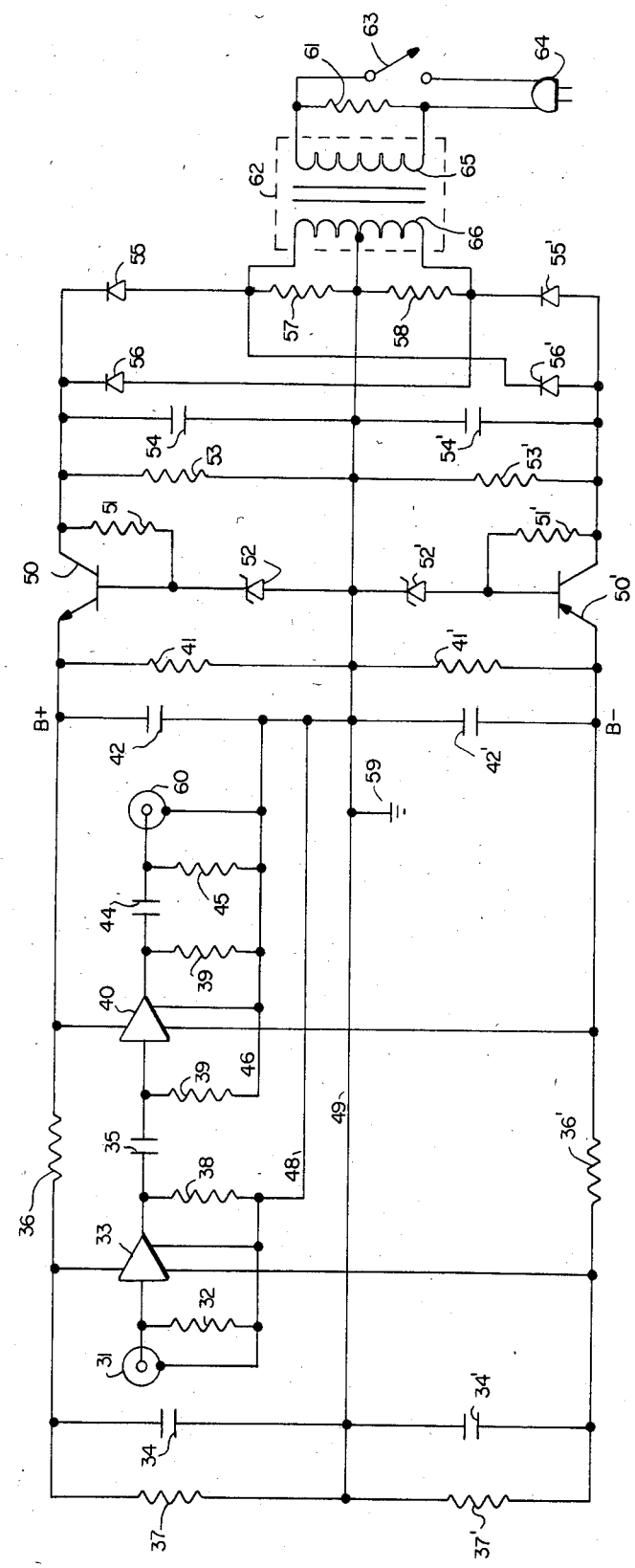
FIG. 2 is a schematic diagram of a two-stage amplifier constructed in accordance with the invention.

In FIG. 2 a form of the invention is illustrated. Here, an input terminal 31 supplies an amplifier 33, the output of which is coupled, through a coupling capacitor 35, to a second amplifier 40. The output of amplifier 40 is coupled to an output terminal 60 through a coupling capacitor 44. Resistors 32 and 39 provide the ground reference for amplifiers 33 and 40. A power transformer 62 is connected to an AC source of power through a plug 64 and a switch 63. Full wave DC rectification is provided by diodes 55 and 56 for B+ and diodes 55' and 56' for B− in conjunction with a center tapped secondary winding 66 on transformer 62. The positive DC voltage developed is filtered by a capacitor 54 and stabilized by a transistor 50, a Zener diode 52 and a filter capacitor 42. The negative DC voltage developed is filtered by capacitor 54' and stabilized by a transistor 50', a Zener diode 52' and a filter capacitor 42'. Resistors 36 and 36' and capacitors 34 and 34' decouple amplifier 33 from amplifier 40.

The inventive aspect of the circuit resides in the addition of suitable resistors across each reactive element that is capable of storing energy. These resistors are 37, 37', 41, 41' and 53, 53' across the power supply capacitors 34, 34', 42, 42' and 54, 54' respectively; resistors 38 and 43 coupling the outputs of amplifiers 33 and 40, respectively, to ground; resistor 61 across the transformer primary winding 65 and resistors 57 and 58 across each half of the transformer secondary winding 66.

To achieve the benefit in reduction of shock excited distortion and consequent reduction of the noise floor resulting from undesirable energy storage in the reactive circuit elements, the optimum value of these energy dissipating resistors has been found to be surprisingly large. Noticeable benefit is obtained with resistor values ranging from 5 K ohms to 100 K ohms depending upon the values of the energy storage components and the voltages applied thereto. Of particular interest was the discovery that after energy dissipating resistors were used in conjunction with the capacitors, a similarly large valued resistor of 100 K ohms further improved audio quality when placed across the primary winding of the power transformer. Experimentation showed the optimum resistor value for each winding of a power transformer to be that which resulted in a current flow in the range of 1 milliamperes to 5 milliamperes. While not fully understood, it is believed that the improvement in reduction of distortion is because the power lines supplying AC power to the amplifier are not a true resistive source.

To further reduce the effects of shock excited currents in the power supply capacitors, the ground return for these capacitors are separated from the amplifier grounds as illustrated by separate ground return leads 46, 48 and 49. While the distortion reduction of each of the above steps is in itself small, the cumulative total of all of the steps is quite evident. The unexpectedly large optimum values of dissipation resistors to reduce time displacement distortions in these energy storage elements permit their use with minimal effect on the efficiency of the amplifier. This is quite unlike the use of prior art discharge resistors which, because of their function, were of much lower values and resulted in substantial power loss.

In FIG. 3 a negative feedback amplifier incorporating the invention is illustrated. Negative feedback amplifiers are widely used to reduce distortion, stabilize operating points and reduce noise. In the prior art, the amount of negative feedback is limited by a form of input stage overload which becomes worse as the amount of negative feedback is increased. Before this effect was recognized, there were a number of years in which amplifier circuits having up to 70 dB of negative feedback were common. It is interesting to note that these amplifier designs exhibited practically unmeasurable distortion on laboratory test instruments. Yet, they were correctly criticized by discriminating listeners as sounding grossly inferior to earlier amplifier designs which actually showed higher distortions when measured on laboratory test equipment. The seeming paradox was resolved when Otala noted the above-mentioned severe input overload effect, which could result from a combination of insufficient input stage voltage swing capacity and excessive negative feedback. This form of feedback-induced distortion is known as transient intermodulation distortion or TIM. The recognition of TIM resulted in a marked reduction in negative feedback in amplifiers and a correspondingly large sonic improvement. Even low negative feedback amplifiers however, may be further improved by additional reductions in negative feedback, which phenomenon has puzzled audio experts for many years. It is also known that negative feedback in excess of about 30 dB reduces the apparent dynamic range of the amplifiers, even though the accepted tests for measuring TIM seem to indicate that the TIM effect is not involved. Indeed, some designers have eliminated overall loop feedback totally, although such amplifier designs have not proven noteworthy in quality. With the application of the principles of the present invention, a substantial increase in negative feedback results in sonic improvement in all areas, including better dynamic accuracy; improvements which have not been obtainable with prior designs.

An input terminal 70 couples a source of audio signals to an amplifier 72, the output of which is supplied to an output terminal 83. A resistor 71 provides a ground reference for terminal 70 and B+ and B− voltages are supplied to amplifier 72 and to filter capacitors 78 and 78', respectively. A ground reference return resistor 82 is provided for output terminal 83. AC negative feedback is derived from the output of amplifier 72 by a voltage divider consisting of a series-connected pair of resistors 73 and 74 connected in series with a capacitor 76. Capacitor 76 is commonly used to provide 100% DC negative feedback to stabilize the operating points of the amplifier and is of particular need if the amplifier is DC coupled to a succeeding amplifier rather than being AC coupled through a coupling capacitor. The improvements of the present invention reduce the undesirable signal-induced shock excited energy storage in signal handling capacitor 76 and power capacitors 78, 78', 91 and 91' by means of dissipating resistors 75, 79, 79', 90 and 90', respectively. Additionally, the ground return paths of the filter capacitors and amplifier 72 are separated until a common ground point 85.

Positive DC power is supplied by full wave rectifier diodes 92 and 93, with capacitor 91 acting as a source of DC energy storage. Resistor 90 is connected in shunt with this capacitor to reduce the undesirable shock excited currents. In a similar manner, negative DC power is supplied by diodes 92' and 93', with capacitor 91' acting as a source of energy storage. The power transformer 100 has two independent secondary windings 96 and 96'. The purpose of these two separate windings is to eliminate any DC component from the transformer, which can occur when a single winding supplies both the B+ and B− rectifiers, as in FIG. 1 and FIG. 2. When a single winding is used, a small, but detrimental, current that is proportional to the difference between the B+ and the B− currents will appear in the secondary winding. This condition is produced by the non-symmetrical nature of audio signals, i.e., where the positive cycle does not contain the same energy as the negative cycle. This unbalanced current is one of the sources of the shock excited energy in the power transformer and can be observed by differentially comparing the voltages at the ends of a single secondary winding.

FIG. 4a is an oscilloscope trace of the differential voltage between the ends of a single secondary transformer winding when both B+ and B− load currents are equal. FIG. 4b shows the oscilloscope trace for a load unbalance of 10%. The generation of a DC unbalance due to the current is quite evident. When two secondaries are used, one to generate the B+ and the other to generate the B−, the unbalanced current in the core cannot occur despite the B− load current imbalance.

Each of the windings of transformer 100 is shunted with energy dissipating resistors. The primary winding 97 is shunted with a resistor 98, secondary winding 96 is shunted by resistors 94, and 95 and secondary winding 96' is shunted by resistors 94' and 95'. While one resistor may be used across each of the secondary windings, it is preferable to shunt each half as shown. The values of these shunt resistors should be selected to draw from 1 to 5 milliamperes and typically puts them in a range from 5 K ohms for very low voltage windings to 100 K ohms for higher voltage windings. Resistors of one-half watt power rating are generally adequate except across 120 volt windings where 1 watt resistors should be used. The exact values of the shunt resistors are not critical. But, as described before, each of the reactive components, even those of the power transformer, which do not appear to be directly involved with the audio signal currents, interact with the audio signal and contribute to the signal related shock excited distortion. It is surprising that even with filters having a capacity of 25,000 microfarads in a power amplifier power supply or having a capacity of 10,000 microfarads in a preamplifier power supply, the time displacement distortion reduction effect of shunt resistors having values between 15 K and 50 K ohms across the transformer windings are quite noticeable. It can only be assumed that impractically large values of filter capacitors would be needed before the power transformer would no longer noticeably contribute to shock excited distortion.

The control of the signal-related shock excited energy in each circuit reactance allows a substantial increase in negative feedback without experiencing the undesirable feedback-related effects such as loss of dynamic range and high frequency shrillness. For example, in a 100 watt amplifier, the negative feedback was increased from 26 dB to 42 dB, without adverse effect, after incorporation of the present invention. The measured intermodulation distortion was reduced from 0.015% to 0.008%. More importantly, the ability of the amplifier to reproduce audio attacks, its quieting between notes and its ability to simulate spatial and source locations, were all dramatically improved. Without the invention, all of these qualities, with the exception of measured intermodulation distortion, were degraded by increasing the feedback to more than 26 dB.

As mentioned, the range of improvement for audio amplifier circuits has centered about the use of energy dissipation resistors having values from 5 K to 100 K ohms. The preferred range is from 20 K to 50 K ohms. It is recognized, of course, that serious departures from the optimum range will result in correspondingly reduced benefits from use of the invention. However, the particular values should not be considered as strict limitations on the invention. Similarly, to maximize the benefits of the invention, all of the reactive and inductive elements should be treated with energy-absorbing resistors to reduce time displacement distortion. However, use of the invention on less than all of the reactive components will produce benefits in accordance with the proportion of usage.

What has been described is a novel arrangement for improving the sound quality of high quality audio amplifiers. It is recognized that numerous modifications and changes in the described embodiment of the invention will be apparent to those skilled in the art without departing from the true spirit and scope thereof. The invention is to be limited only as defined in the claims.

What is claimed is:

1. An amplifier system comprising:
    a DC power supply;
    a signal amplifying gain stage coupled to said DC power supply;
    means supplying an audio signal that is transient and unsymmetrical in nature to said signal amplifying gain stage for amplification thereby;
    a plurality of energy storing filter capacitors in said DC power supply interconnected with said signal amplifying gain stage and interacting therewith and producing undesirable time displacement distortion in said audio signal; and
    continuously active energy dissipating damping means comprising resistors connected in parallel with at least some of said filter capacitors.

2. The amplifier of claim 1 further including a signal coupling capacitor in the path of said audio signal and a pair of resistors in circuit with said signal coupling capacitor.

3. The amplifier of claim 2 further including a transformer winding in said DC power supply and an energy dissipating resistor connected in circuit with said transformer winding and wherein said resistors in parallel with and in circuit with said filter capacitors and with said signal coupling capacitor, respectively, each have a value in the range of 5 K to 100 K ohms and said energy dissipating resistor connected in circuit with said transformer winding has a value selected to produce a current in the range of 1 milliampere to 5 milliamperes in said energy dissipating resistor.

4. A power supply for use with a high resolution amplifier system comprising:
    a transformer having a primary winding connectable to a source of AC line current and a secondary winding;
    rectifying means coupled to said secondary winding for producing a pulsating DC current;
    filter means coupled to said rectifier means for producing a substantially constant output voltage; and
    energy dissipating damping means connected across at least one of said windings, said energy dissipating damping means being selected to draw between 1 milliampere and 5 milliamperes of current from said one winding.

5. The transformer of claim 4 wherein said energy dissipating damping means comprises a resistor.

6. The transformer of claim 5 further including;
    a pair of separate secondary windings coupled to said rectifying means for developing independent positive and negative DC voltages.

7. The transformer of claim 6 wherein energy absorbing resistors are connected across each of the windings of said transformer.

8. An amplifier system comprising:
    a DC power supply;
    a signal amplifying gain stage coupled to said DC power supply;
    means supplying an audio signal that is transient and unsymmetrical in nature to said signal amplifying gain stage for amplification thereby;
    a plurality of energy storing capacitive reactive elements interconnected with said signal amplifying gain stage and interacting therewith and producing undesirable time displacement distortion in said audio signal; and
    continuously active energy dissipating damping means connected in circuit with at least some of said capacitive reactive elements, said energy storing capacitive reactive elements comprising at least one signal coupling capacitor and wherein said continuously active energy dissipating means comprise a resistor connected between each end of said coupling capacitor and ground.

* * * * *